US011700746B2

(12) United States Patent
Wang et al.

(10) Patent No.: US 11,700,746 B2
(45) Date of Patent: Jul. 11, 2023

(54) DISPLAY SUBSTRATE, DISPLAY APPARATUS, AND METHOD OF FABRICATING DISPLAY SUBSTRATE

(71) Applicants: Chengdu BOE Optoelectronics Technology Co., Ltd., Sichuan (CN); BOE Technology Group Co., Ltd., Beijing (CN)

(72) Inventors: Shilong Wang, Beijing (CN); Zhiliang Jiang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/743,260

(22) Filed: May 12, 2022

(65) Prior Publication Data

US 2022/0271258 A1    Aug. 25, 2022

Related U.S. Application Data

(63) Continuation of application No. 16/494,678, filed as application No. PCT/CN2018/113653 on Nov. 2, 2018, now Pat. No. 11,362,303.

(51) Int. Cl.
*H10K 50/844* (2023.01)
*H10K 59/17* (2023.01)
(Continued)

(52) U.S. Cl.
CPC ........ *H10K 50/844* (2023.02); *H10K 59/124* (2023.02); *H10K 59/17* (2023.02);
(Continued)

(58) Field of Classification Search
None
See application file for complete search history.

(56) References Cited

U.S. PATENT DOCUMENTS

2002/0185967 A1    12/2002  Friend et al.
2016/0064691 A1     3/2016  Lee et al.
(Continued)

FOREIGN PATENT DOCUMENTS

| CN | 105390525 A | 3/2016 |
| CN | 105789252 A | 7/2016 |

(Continued)

OTHER PUBLICATIONS

International Search Report & Written Opinion dated Aug. 8, 2019, regarding PCT/CN2018/113653.
(Continued)

*Primary Examiner* — Michelle Mandala
(74) *Attorney, Agent, or Firm* — Intellectual Valley Law, P.C.

(57) ABSTRACT

A display substrate has a display area and a peripheral area. The display substrate includes a base substrate; an insulating layer on the base substrate and in at least the peripheral area; a plurality of light emitting elements on the base substrate and in the display area; an encapsulating layer on a side of the plurality of light emitting elements distal to the base substrate to encapsulate the plurality of light emitting elements; and a dam layer on a side of the insulating layer distal to the base substrate. The encapsulating layer includes a first inorganic encapsulating sublayer extending from the display area into the peripheral area. The display substrate has a groove extending into the first insulating layer in the peripheral area, and substantially surrounding the display area. The first inorganic encapsulating sublayer extends into at least a portion of the groove.

19 Claims, 11 Drawing Sheets

(51) Int. Cl.
  *H10K 59/124* (2023.01)
  *H10K 71/00* (2023.01)
  *H10K 50/842* (2023.01)
  *H10K 59/122* (2023.01)
  *H10K 59/173* (2023.01)

(52) U.S. Cl.
  CPC ......... *H10K 71/00* (2023.02); *H10K 50/8428* (2023.02); *H10K 59/122* (2023.02); *H10K 59/173* (2023.02)

(56) References Cited

U.S. PATENT DOCUMENTS

| | | | |
|---|---|---|---|
| 2016/0204183 A1 | 7/2016 | Tao et al. | |
| 2017/0069873 A1 | 3/2017 | Kim et al. | |
| 2017/0141352 A1 | 5/2017 | Shin | |
| 2017/0288004 A1 | 10/2017 | Kim et al. | |
| 2017/0288007 A1 | 10/2017 | Shin et al. | |
| 2018/0053905 A1 | 2/2018 | Lee et al. | |
| 2018/0076230 A1* | 3/2018 | Kwak | H01L 27/1218 |
| 2018/0097034 A1* | 4/2018 | Lee | H01L 51/5253 |
| 2018/0198092 A1* | 7/2018 | Choi | H01L 51/5253 |
| 2018/0254431 A1* | 9/2018 | Kim | H01L 51/5256 |
| 2020/0135835 A1 | 4/2020 | Seo et al. | |
| 2020/0161398 A1 | 5/2020 | Bang et al. | |

FOREIGN PATENT DOCUMENTS

| | | |
|---|---|---|
| CN | 106711171 A | 5/2017 |
| CN | 107195794 A | 9/2017 |
| CN | 107275366 A | 10/2017 |
| CN | 107768405 A | 3/2018 |
| CN | 108598287 A | 9/2018 |

OTHER PUBLICATIONS

First Office Action in the Chinese Patent Application No. 201880001906.1, dated May 28, 2020; English translation attached.
Second Office Action in the Chinese Patent Application No. 201880001906.1, dated Feb. 23, 2021; English translation attached.
Non-Final Office Action in the U.S. Appl. No. 16/494,678, dated Sep. 30, 2021.
Response to Non-Final Office Action in the U.S. Appl. No. 16/494,678, dated Dec. 21, 2021.
Notice of Allowance in the U.S. Appl. No. 16/494,678, dated Feb. 14, 2022.

* cited by examiner

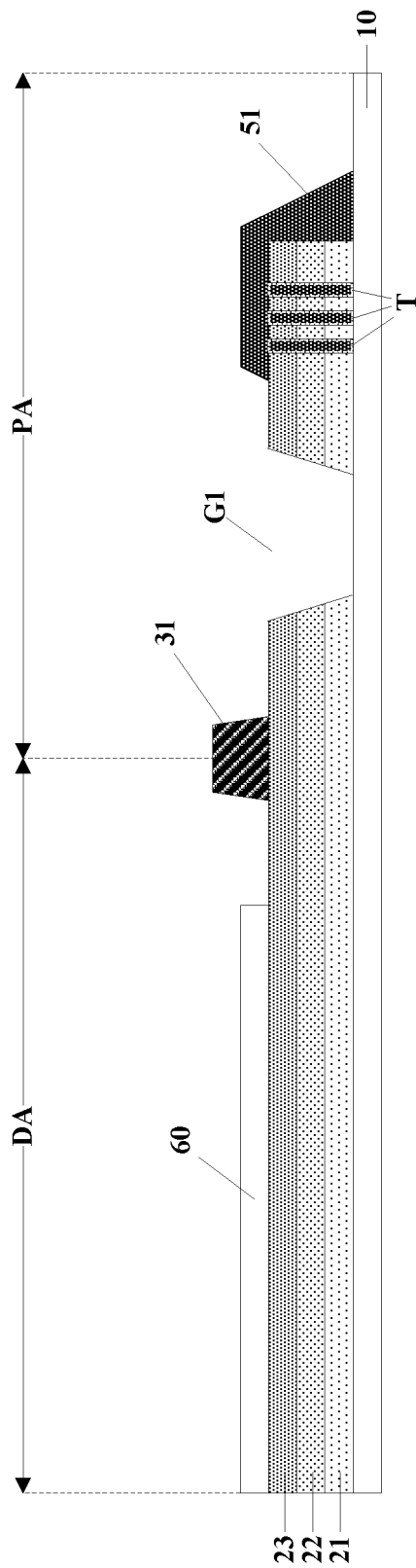
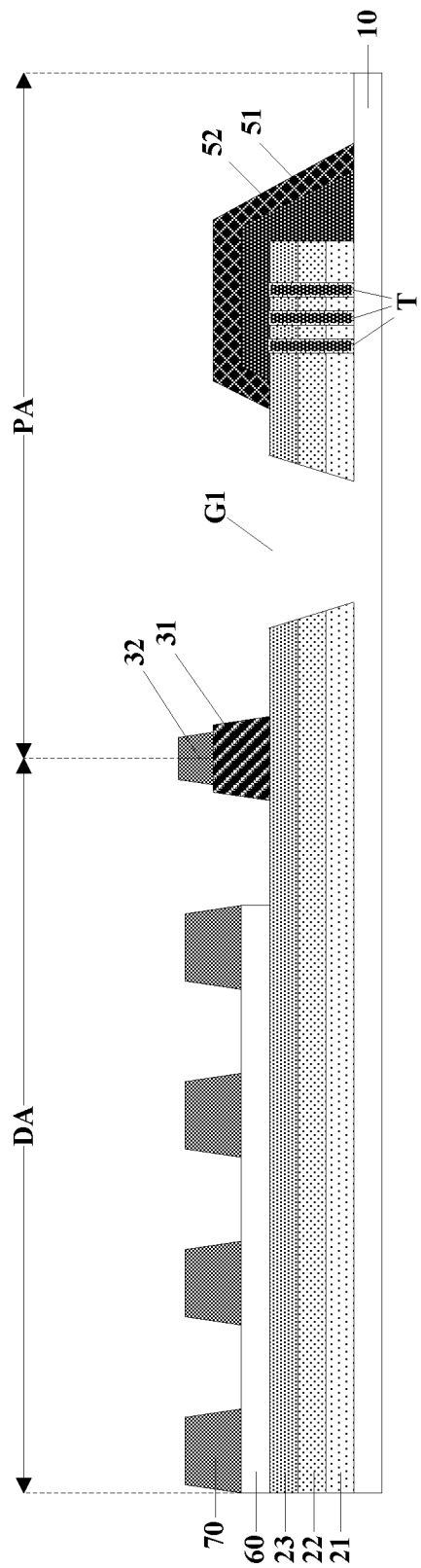
FIG. 8C
FIG. 8D

DISPLAY SUBSTRATE, DISPLAY APPARATUS, AND METHOD OF FABRICATING DISPLAY SUBSTRATE

This application is a continuation of U.S. application Ser. No. 16/494,678, filed Nov. 2, 2018, which is a national stage application under 35 U.S.C. § 371 of International Application No. PCT/CN2018/113653, filed Nov. 2, 2018, the contents of which are incorporated by reference in the entirety.

TECHNICAL FIELD

Background

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus. An OLED display apparatus typically includes an anode, an organic layer including an organic light emitting layer, and a cathode. OLEDs can be either a bottom-emission type OLED or a top-emission type OLED.

SUMMARY

In one aspect, the present disclosure provides a display substrate having a display area and a peripheral area, comprising a base substrate; an insulating layer on the base substrate and in at least the peripheral area; a plurality of light emitting elements on the base substrate and in the display area; an encapsulating layer on a side of the plurality of light emitting elements distal to the base substrate to encapsulate the plurality of light emitting elements; and a dam layer on a side of the insulating layer distal to the base substrate; wherein the encapsulating layer comprises a first inorganic encapsulating sublayer extending from the display area into the peripheral area; the display substrate has a groove extending into the insulating layer in the peripheral area, and substantially surrounding the display area; the groove is on a side of the dam layer away from the display area; and the first inorganic encapsulating sublayer extends into at least a portion of the groove; wherein the dam layer comprises a first dam sublayer on a side of the insulating layer distal to the base substrate; a second dam sublayer on a side of the first dam sublayer distal to the insulating layer; and a third dam sublayer on a side of the second dam sublayer distal to the first dam sublayer.

Optionally, the groove forms a first perimeter substantially surrounding the display area; and the first inorganic encapsulating sublayer extends into the groove substantially around the first perimeter.

Optionally, the encapsulating layer further includes a second inorganic encapsulating sublayer on a side of the first inorganic encapsulating sublayer distal to the base substrate; and the second inorganic encapsulating sublayer extends into at least a portion of the groove.

Optionally, the groove forms a first perimeter substantially surrounding the display area; and the second inorganic encapsulating sublayer extends into the groove substantially around the first perimeter.

Optionally, the groove has a depth along a direction from the insulating layer to the base substrate greater than 50 nm.

Optionally, the groove has a width along a direction from the display area to the peripheral area greater than 10 μm.

Optionally, the groove extends into a plurality of insulating layers comprising the insulating layer.

Optionally, the insulating layer is an inter-layer dielectric layer.

Optionally, the groove extends into the insulating layer, a second insulating layer on a side of the insulating layer distal to the base substrate, and a third insulating layer on a side of the second insulating layer distal to the base substrate; and the third insulating layer is an inter-layer dielectric layer.

Optionally, the display substrate further comprises a crack barrier layer on the base substrate and in the peripheral area.

Optionally, the groove forms a first perimeter substantially surrounding the display area; the display substrate has one or more trenches extending into the insulating layer in the peripheral area, forming one or more second perimeters each of which substantially surrounding the first perimeter; and the crack barrier layer extends into the one or more trenches.

Optionally, the one or more trenches has a depth along a direction from the insulating layer to the base substrate substantially same as a depth of the groove along the direction from the insulating layer to the base substrate.

Optionally, the crack barrier layer comprises a first barrier sublayer and a second barrier sublayer on a side of the first barrier sublayer distal to the base substrate; and the first barrier sublayer extends into the one or more trenches.

Optionally, the dam layer forms a third perimeter substantially surrounding the display area.

Optionally, the display substrate further comprises a planarization layer in the display area; a pixel definition layer defining a plurality of subpixel apertures on a side of the planarization layer distal to the base substrate; and a spacer layer for spacing apart the display substrate from a counter substrate in a display panel comprising the display substrate; wherein the first dam sublayer and the planarization layer are in a same layer and comprises a same material; the second dam sublayer and the pixel definition layer are in a same layer and comprises a same material; and the third dam sublayer and the spacer layer are in a same layer and comprises a same material.

Optionally, the display substrate has a single groove extending into the insulating layer in the peripheral area, and substantially surrounding the display area; and a cross-section of the groove along a plane perpendicular to the base substrate and intersecting the display area and the peripheral area has a substantially inverted trapezoidal shape.

Optionally, a depth of the groove is less than a thickness of the dam layer.

Optionally, the display substrate further comprises a first gate insulating layer and a second gate insulating layer; wherein the insulating layer is an inter-layer dielectric layer between the second gate insulating layer and the dam layer.

In another aspect, the present disclosure provides a display apparatus, comprising the display substrate described herein; and a counter substrate facing the display substrate.

In another aspect, the present disclosure provides a method of fabricating a display substrate having a display area and a peripheral area, comprising forming an insulating layer on a base substrate and in at least the peripheral area; forming a groove extending into the insulating layer in the peripheral area, and substantially surrounding the display area; forming a plurality of light emitting elements on the base substrate and in the display area; forming an encapsulating layer on a side of the plurality of light emitting elements distal to the base substrate to encapsulate the plurality of light emitting elements; and forming a dam layer on a side of the insulating layer distal to the base substrate; wherein forming the encapsulating layer comprises forming a first inorganic encapsulating sublayer extending from the display area into the peripheral area; the groove is on a side of the dam layer away from the display area; and the first inorganic encapsulating sublayer is formed so that the first inorganic encapsulating sublayer extends into at least a portion of the groove; wherein the dam layer comprises a first dam sublayer on a side of the insulating layer distal to the base substrate; a second dam sublayer on a side of the first dam sublayer distal to the insulating layer; and a third dam sublayer on a side of the second dam sublayer distal to the first dam sublayer.

BRIEF DESCRIPTION OF THE FIGURES

The following drawings are merely examples for illustrative purposes according to various disclosed embodiments and are not intended to limit the scope of the present invention.

FIGS. 8A to 8E illustrate a process of fabricating a display substrate in some embodiments according to the present disclosure.

DETAILED DESCRIPTION

Figure 1:
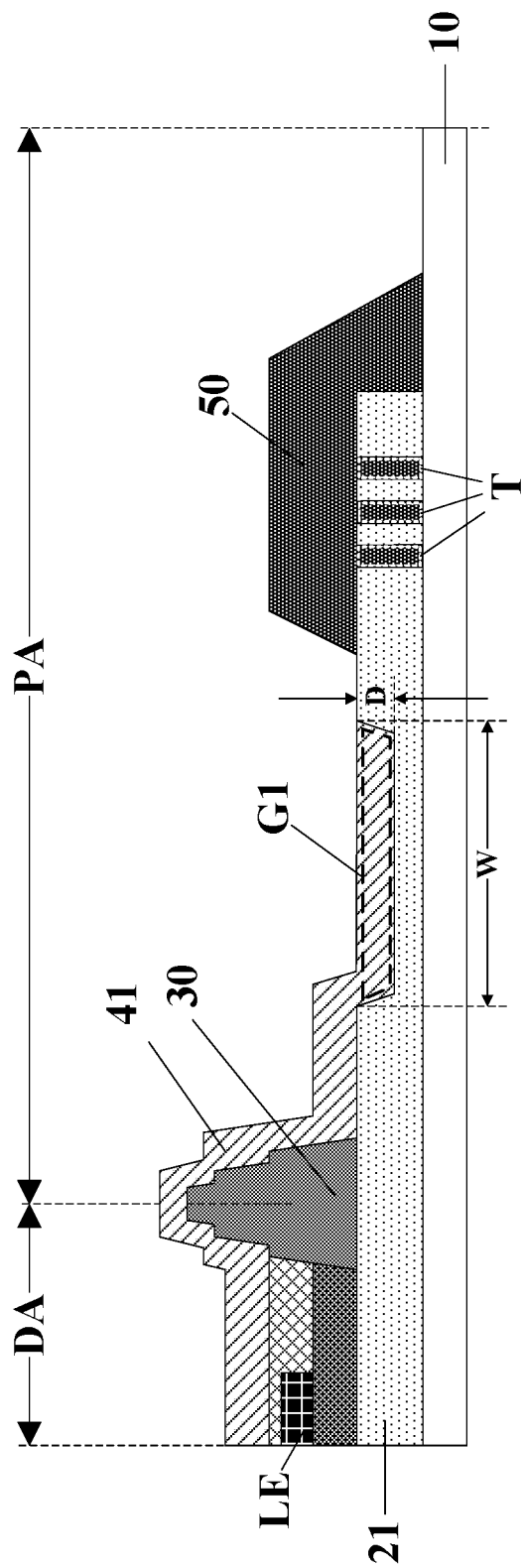
FIG. 1 is a schematic diagram illustrating the structure of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

It is discovered in the present disclosure that inorganic encapsulating sublayers of an encapsulating layer in a display substrate is prone to being peeling off an insulating layer of the display substrate, particularly when subject to external force, leading to defects in encapsulation.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate having a display area and a peripheral area. In some embodiments, the display substrate includes a base substrate; a first insulating layer on the base substrate and in at least the peripheral area; a plurality of light emitting elements on the base substrate and in the display area; and an encapsulating layer on a side of the plurality of light emitting elements distal to the base substrate to encapsulate the plurality of light emitting elements. Optionally, the encapsulating layer includes a first inorganic encapsulating sublayer extending from the display area into the peripheral area. Optionally, the display substrate has a groove extending into the first insulating layer in the peripheral area, forming a first perimeter substantially surrounding the display area. Optionally, the first inorganic encapsulating sublayer extends into at least a portion of the groove.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

As used herein the term "substantially surrounding" refers to surrounding at least 50% (e.g., at least 60%, at least 70%, at least 80%, at least 90%, at least 95%, at least 99%, and 100%) of a perimeter of an area.

Figure 3:
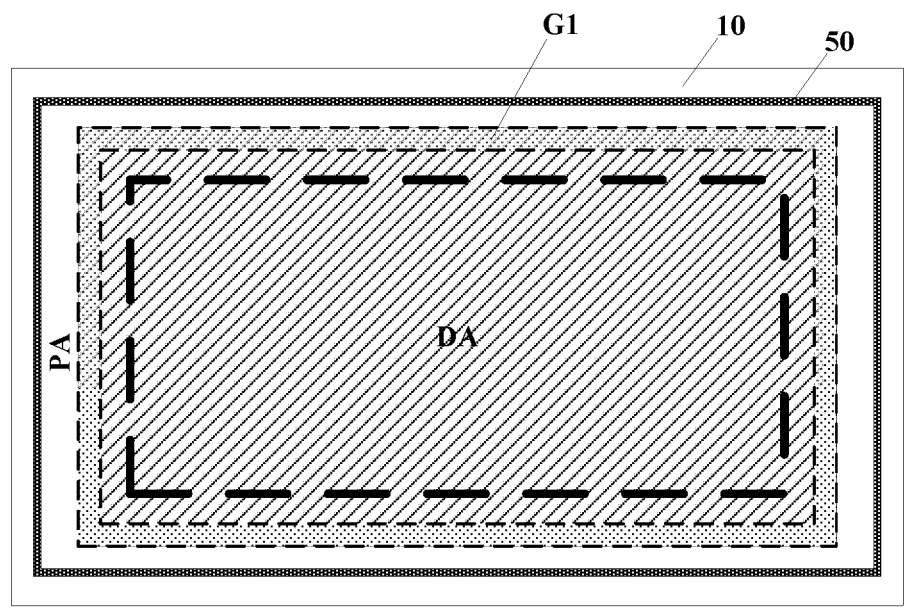
FIG. 3 is a plan view of a display substrate in some embodiments according to the present disclosure.

FIG. 1 is a schematic diagram illustrating the structure of a display substrate in some embodiments according to the present disclosure. FIG. 3 is a plan view of a display substrate in some embodiments according to the present disclosure. Referring to FIG. 1 and FIG. 3, the display substrate in some embodiments has a display area DA and a peripheral area PA. The display substrate in some embodiments includes a base substrate 10; a first insulating layer 21 on the base substrate 10 and in at least the peripheral area PA. In FIG. 1, the first insulating layer 21 extends from the display area DA into at least a part of the peripheral area PA. The display substrate further optionally includes a plurality of light emitting elements LE on the base substrate 10 and in the display area DA, and an encapsulating layer on a side of the plurality of light emitting elements LE distal to the base substrate 10 to encapsulate the plurality of light emitting elements LE. Optionally, and referring to FIG. 1, the encapsulating layer includes a first inorganic encapsulating sublayer 41 extending from the display area DA into the peripheral area PA.

Figure 2A:
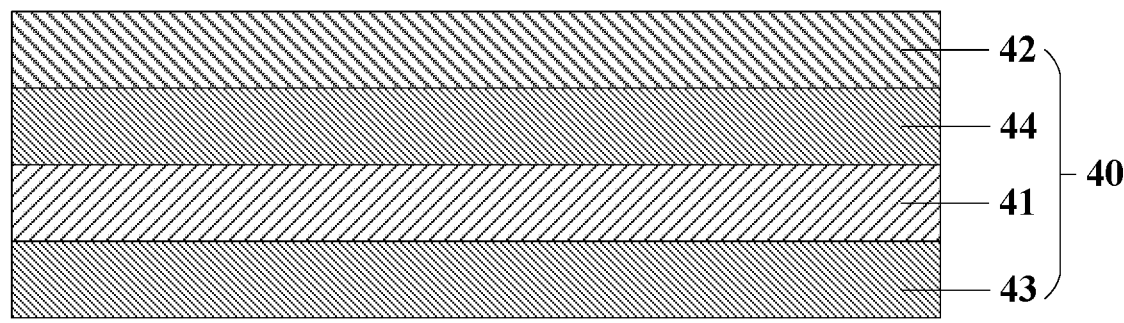
FIG. 2A is a schematic diagram illustrating the structure of an encapsulating layer in some embodiments according to the present disclosure.

FIG. 2A is a schematic diagram illustrating the structure of an encapsulating layer in some embodiments according to the present disclosure. Referring to FIG. 2A, the encapsulating layer in some embodiments may include multiple sublayers, including one or more inorganic encapsulating sublayers and one or more organic encapsulating sublayers for enhanced encapsulation ability to prevent oxygen or moist from entering the display substrate. In one example shown in FIG. 2A, the encapsulating layer 40 includes a first organic encapsulating sublayer 43, a first inorganic encapsulating sublayer 41 on the first organic encapsulating sublayer 43, a second organic encapsulating sublayer 44 on a side of the first inorganic encapsulating sublayer 41 distal to the first organic encapsulating sublayer 43, and a second inorganic encapsulating sublayer 42 on a side of the second organic encapsulating sublayer 44 distal to the first inorganic encapsulating sublayer 41.

Figure 2B:
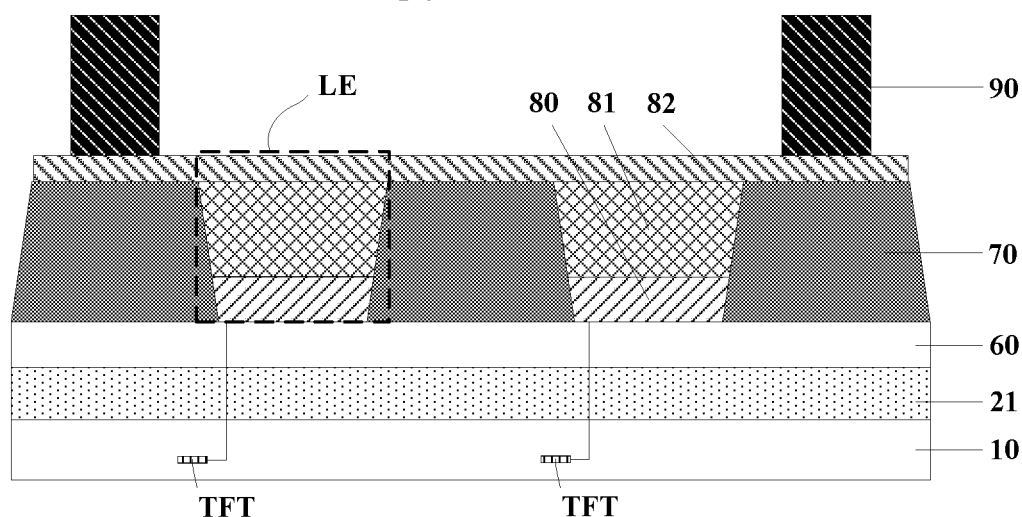
FIG. 2B is a schematic diagram illustrating the structure of display substrate in a display area in some embodiments according to the present disclosure.

FIG. 2B is a schematic diagram illustrating the structure of display substrate in a display area in some embodiments according to the present disclosure. Referring to FIG. 2B, the display substrate in the display area includes a base substrate 10, the first insulating layer 21 on the base substrate 10, a planarization layer 60 on a side of the first insulating layer 21 distal to the base substrate 10, a pixel definition layer 70 on a side of the planarization layer 60 distal to the base substrate 10 and defining a plurality of subpixel apertures, and a spacer layer 90 on a side of the pixel definition layer 70 distal to the base substrate 10. The spacer layer 90 is configured to space apart the display substrate from a counter substrate in a display panel having the display substrate. Each of the plurality of light emitting elements LE in some embodiments includes a first electrode 80, a light emitting layer 81 in a respective one of the plurality of subpixel apertures and on a side of the first electrode 80 distal to the base substrate 10, and a second electrode 82 on a side of the light emitting layer 81 distal to the first electrode 80. The second electrode 82 may be formed to extend throughout the display area in an open mask process.

Referring to FIG. 1, in some embodiments, the display substrate has a groove G1 extending into the first insulating layer 21 in the peripheral area PA, forming a first perimeter substantially surrounding the display area DA. Optionally, the first inorganic encapsulating sublayer 41 extends into at least a portion of the groove G1. As used herein, the term "extend into" is used to refer to extending partially through or extending through completely. In FIG. 1, the groove G1 only partially extends through the first insulating layer 21.

In some embodiments, and referring to FIG. 1 and FIG. 3, the first inorganic encapsulating sublayer 41 extends into the groove G1 substantially around the first perimeter. For example, the first inorganic encapsulating sublayer 41 extends into the groove G1 at every part of the first perimeter.

In some embodiments, the first inorganic encapsulating sublayer 41 extends into the groove G1 at some parts of the first perimeter, but is absent in the groove G1 at other parts of the first perimeter.

Figure 4:
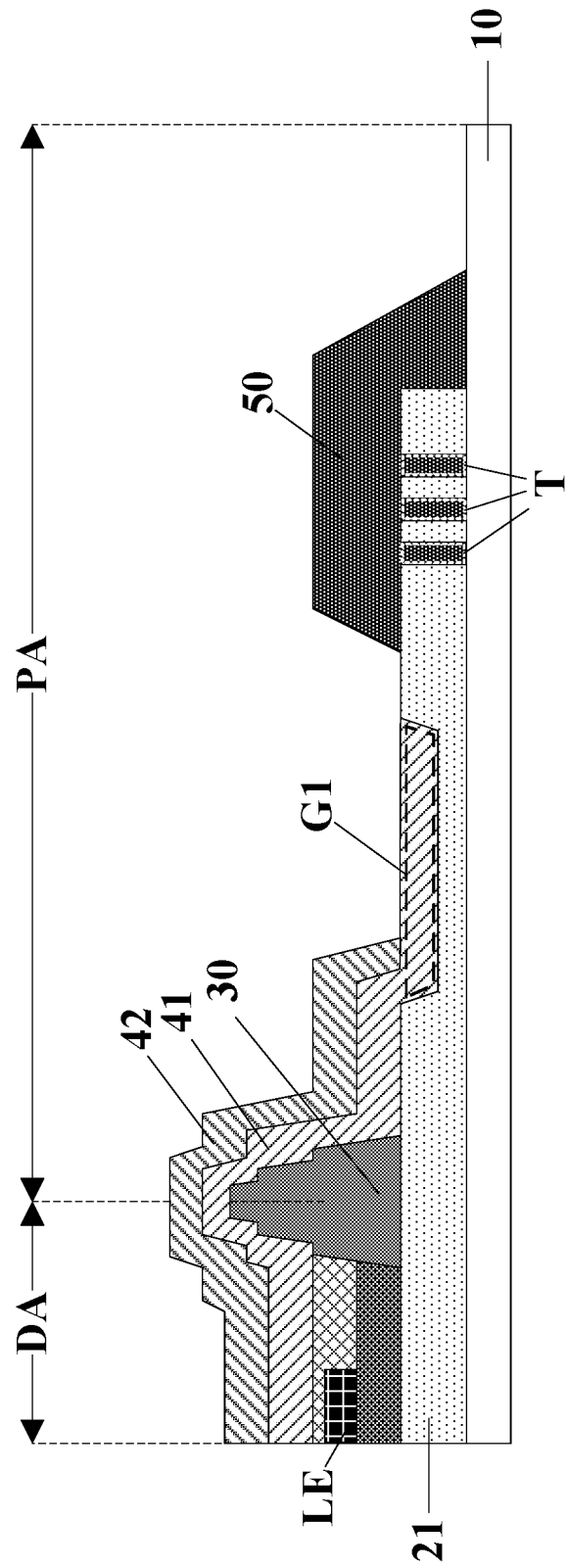
FIG. 4 is a schematic diagram illustrating the structure of a display substrate in some embodiments according to the present disclosure.

FIG. 4 is a schematic diagram illustrating the structure of a display substrate in some embodiments according to the present disclosure. Referring to FIG. 4, the encapsulating layer in some embodiments further includes a second inorganic encapsulating sublayer 42 on a side of the first inorganic encapsulating sublayer 41 distal to the base substrate 10. Similar to the first inorganic encapsulating sublayer 41, the second inorganic encapsulating sublayer 42 also extends from the display area DA into the peripheral area PA. In the display substrate as shown in FIG. 4, the second inorganic encapsulating sublayer 42 does not extend into the groove G1.

Figure 5:
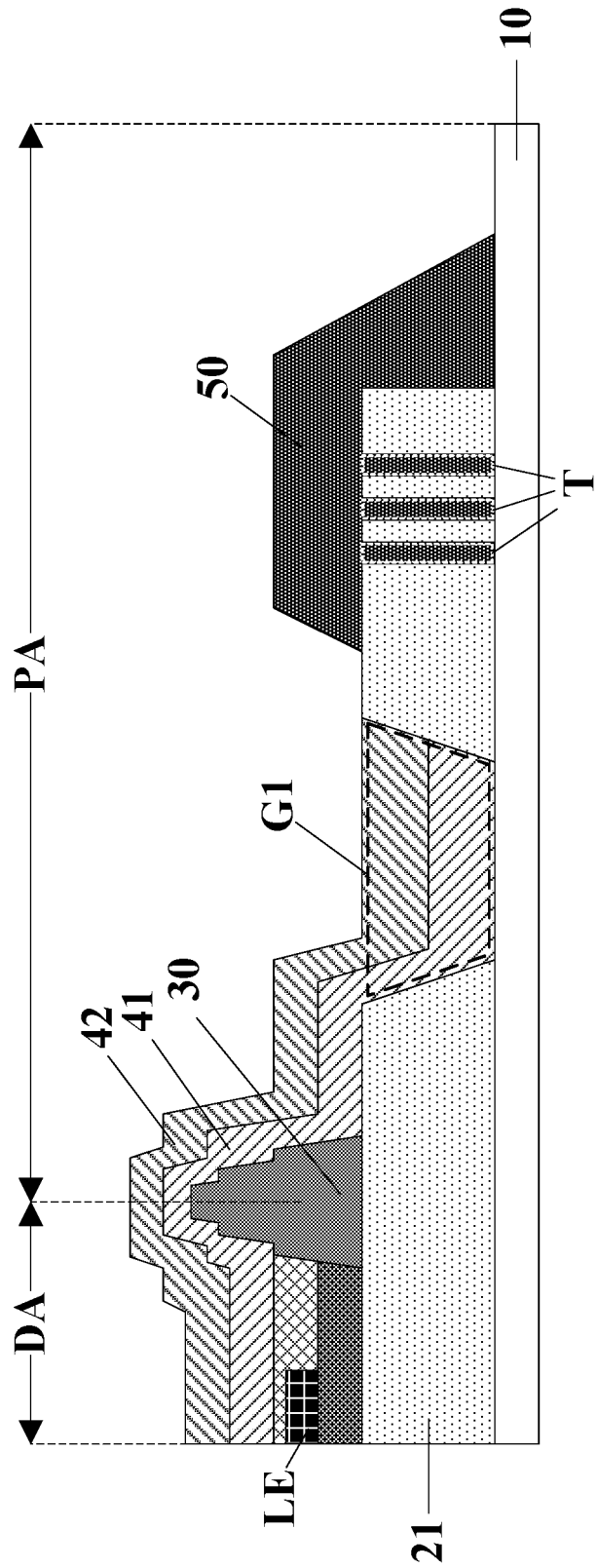
FIG. 5 is a schematic diagram illustrating the structure of a display substrate in some embodiments according to the present disclosure.

FIG. 5 is a schematic diagram illustrating the structure of a display substrate in some embodiments according to the present disclosure. Referring to FIG. 5, the encapsulating layer in some embodiments further includes a second inorganic encapsulating sublayer 42 on a side of the first inorganic encapsulating sublayer 41 distal to the base substrate 10. In the display substrate as shown in FIG. 5, not only the first inorganic encapsulating sublayer 41 extends into at least a portion of the groove G1, but also the second inorganic encapsulating sublayer 42 extends into at least a portion of the groove G1. In FIG. 5, the groove G1 extends through the first insulating layer 21.

In some embodiments, the second inorganic encapsulating sublayer 42 extends into the groove G1 substantially around the first perimeter. For example, the second inorganic encapsulating sublayer 42 extends into the groove G1 at every part of the first perimeter.

In some embodiments, the second inorganic encapsulating sublayer 42 extends into the groove G1 at some parts of the first perimeter, but is absent in the groove G1 at other parts of the first perimeter.

Referring to FIG. 1, in some embodiments, the groove G1 has a depth D along a direction from the first insulating layer 21 to the base substrate 10. Optionally, the depth D is greater than 50 nm, e.g., greater than 100 nm, greater than 200 nm, greater than 300 nm, greater than 400 nm, greater than 500 nm, greater than 600 nm, greater than 700 nm, greater than 800 nm, greater than 900 nm, and greater than 1000 nm. Optionally, the depth D is in a range of approximately 500 nm to approximately 700 nm, e.g., approximately 600 nm.

Referring to FIG. 1, in some embodiments, the groove G1 has a width W along a direction from the display area DA to the peripheral area PA. Optionally, the width W is greater than 10 μm, e.g., greater than 20 μm, greater than 30 μm, greater than 40 μm, greater than 50 μm, greater than 60 μm, greater than 70 μm, greater than 80 μm, greater than 90 μm, greater than 100 μm, greater than 150 μm, greater than 200 μm, and greater than 500 μm. Optionally, the width W is in a range of approximately 50 μm to approximately 150 μm, e.g., approximately 100 μm.

Referring to FIGS. 1, 4, and 5, in some embodiments, the display substrate further includes a crack barrier layer 50 on the base substrate 10 and in the peripheral area PA. The crack barrier layer 50 is on a side of the groove G1 distal to the display area DA. Optionally, the crack barrier layer 50 is formed to surround the first perimeter formed by the groove G1.

In some embodiments, the display substrate has one or more trenches T extending into the first insulating layer 21 in the peripheral area PA, forming one or more second perimeters each of which substantially surrounding the first perimeter. The crack barrier layer 50 extends into the one or more trenches T. Optionally, the one or more trenches T and the groove G1 are formed in a single patterning process (e.g., a same etching process) using a single mask plate. Optionally, the one or more trenches T has a depth along a direction from the first insulating layer 21 to the base substrate 10 substantially same as a depth of the groove G1 along the direction from the first insulating layer 21 to the base substrate 10. Optionally, the depth of the one or more trenches T is greater than 50 nm, e.g., greater than 100 nm, greater than 200 nm, greater than 300 nm, greater than 400 nm, greater than 500 nm, greater than 600 nm, greater than 700 nm, greater than 800 nm, greater than 900 nm, and greater than 1000 nm. Optionally, the depth of the one or more trenches T is in a range of approximately 500 nm to approximately 700 nm, e.g., approximately 600 nm.

Referring to FIGS. 1, 4, and 5, in some embodiments, the display substrate further includes a dam layer 30 on a side of the first insulating layer 21 distal to the base substrate 10. The dam layer 30 forms a third perimeter defining the display area DA, e.g., forming a boundary between the display area DA and the peripheral area PA. The first inorganic encapsulating sublayer 41 or the second inorganic encapsulating sublayer 42 climbs over the dam layer 30 and extends from the display area DA into the peripheral area PA.

Figure 6:
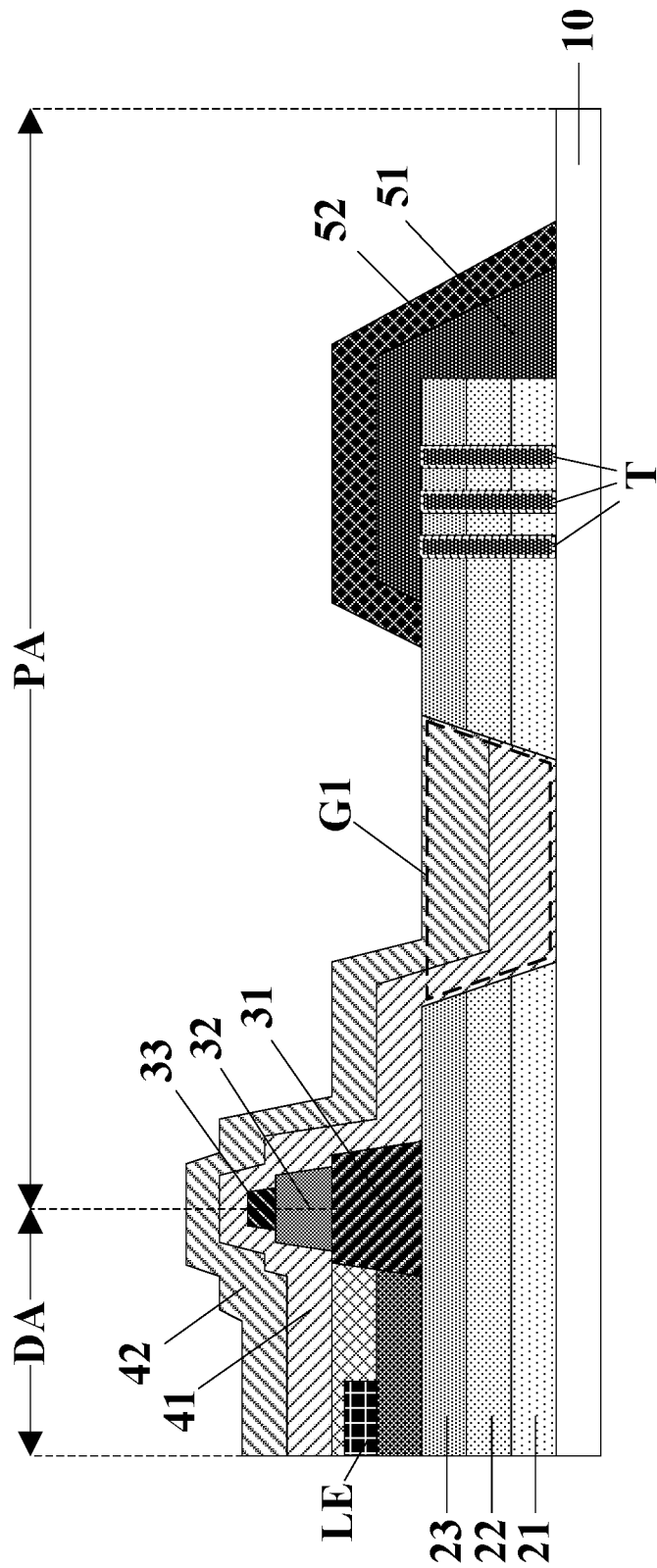
FIG. 6 is a schematic diagram illustrating the structure of a display substrate in some embodiments according to the present disclosure.

In some embodiments, the groove G1 extends into a plurality of insulating layers. FIG. 6 is a schematic diagram illustrating the structure of a display substrate in some embodiments according to the present disclosure. Referring to FIG. 6, the display substrate includes a first insulating layer 21, a second insulating layer 22 on a side of the first insulating layer 21 distal to the base substrate 10, and a third insulating layer 23 on a side of the second insulating layer 22 distal to the base substrate 10. The groove G1 extends into (e.g., extends completely through) the first insulating layer 21, the second insulating layer 22, and the third insulating layer 23.

In one example, the first insulating layer 21 is a first gate insulating layer of the display substrate, the second insulating layer 22 is a second gate insulating layer of the display substrate, and the third insulating layer 23 is an inter-layer dielectric layer of the display substrate.

Referring to FIG. 6 again, in some embodiments, the crack barrier layer includes a first barrier sublayer 51 and a second barrier sublayer 52 on a side of the first barrier sublayer 51 distal to the base substrate 10. Optionally, the first barrier sublayer 51 extends into the one or more trenches T. In some embodiments, the first barrier sublayer 51 and a planarization layer of the display substrate are in a same layer and are made of a same material. As used herein, the term "same layer" refers to the relationship between the layers simultaneously formed in the same step. In one example, the first barrier sublayer 51 and the planarization layer are in a same layer when they are formed as a result of one or more steps of a same patterning process performed in a same layer of material. In another example, first barrier sublayer 51 and the planarization layer can be formed in a same layer by simultaneously performing the step of forming first barrier sublayer 51 and the step of forming the planarization layer. The term "same layer" does not always mean that the thickness of the layer or the height of the layer in a cross-sectional view is the same.

In some embodiments, the second barrier sublayer 52 and a pixel definition layer (see, e.g., FIG. 2B) of the display substrate are in a same layer and are made of a same material.

Referring to FIG. 6 again, in some embodiments, the dam layer includes a first dam sublayer 31 on a side of the first insulating layer 21 distal to the base substrate 10, a second dam sublayer 32 on a side of the first dam sublayer 31 distal to the first insulating layer 21, and a third dam sublayer 33 on a side of the second dam sublayer 32 distal to the first dam sublayer 31. Optionally, the first dam sublayer 31 and a planarization layer (see, e.g., FIG. 2B) of the display substrate are in a same layer and are made of a same material. Optionally, the second dam sublayer 32 and a pixel definition layer (see, e.g., FIG. 2B) of the display substrate are in a same layer and are made of a same material. Optionally, the third dam sublayer 33 and a spacer layer (see, e.g., FIG. 2B) of the display substrate are in a same layer and are made of a same material.

Various appropriate insulating materials and various appropriate fabricating methods may be used to make the crack barrier layer 50, the dam layer 30, the pixel definition layer 70, the planarization layer 60, the first insulating layer 21, the second insulating layer 22, the third insulating layer 23, and the spacer layer 90. For example, an insulating material may be deposited on the substrate by a plasma-enhanced chemical vapor deposition (PECVD) process and patterned. Examples of appropriate insulating materials for making the crack barrier layer 50, the dam layer 30, the pixel definition layer 70, the planarization layer 60, the first insulating layer 21, the second insulating layer 22, the third insulating layer 23, and the spacer layer 90 include, but are not limited to, silicon oxide ($SiO_x$), silicon nitride ($SiN_y$, e.g., $Si_3N_4$), silicon oxynitride ($SiO_xN_y$), various resins, and various organic polymers.

In another aspect, the present disclosure provides a method of fabricating a display substrate having a display area and a peripheral area. In some embodiments, the method includes forming a first insulating layer on the base substrate and in at least the peripheral area; forming a groove extending into the first insulating layer in the peripheral area, the groove forming a first perimeter substantially surrounding the display area; forming a plurality of light emitting elements on the base substrate and in the display area; and forming an encapsulating layer on a side of the plurality of light emitting elements distal to the base substrate to encapsulate the plurality of light emitting elements.

Optionally, the step of forming the encapsulating layer includes forming a first inorganic encapsulating sublayer extending from the display area into the peripheral area. Optionally, the first inorganic encapsulating sublayer is formed so that the first inorganic encapsulating sublayer extends into at least a portion of the groove. Optionally, the first inorganic encapsulating sublayer is formed to extend into the groove substantially around the first perimeter.

Optionally, the step of forming the encapsulating layer further includes forming a second inorganic encapsulating sublayer on a side of the first inorganic encapsulating sublayer distal to the base substrate. Optionally, the second inorganic encapsulating sublayer is formed so that the second inorganic encapsulating sublayer extends into at least a portion of the groove. Optionally, the second inorganic encapsulating sublayer is formed so that the second inorganic encapsulating sublayer extends into the groove substantially around the first perimeter.

Optionally, the groove is formed to have a depth along a direction from the first insulating layer to the base substrate greater than 50 nm. Optionally, the depth is greater than 50 nm, e.g., greater than 100 nm, greater than 200 nm, greater than 300 nm, greater than 400 nm, greater than 500 nm, greater than 600 nm, greater than 700 nm, greater than 800 nm, greater than 900 nm, and greater than 1000 nm. Optionally, the depth is in a range of approximately 500 nm to approximately 700 nm, e.g., approximately 600 nm.

Optionally, the groove is formed to have a width along a direction from the display area to the peripheral area greater than 10 μm. Optionally, the width is greater than 10 μm, e.g., greater than 20 μm, greater than 30 μm, greater than 40 μm, greater than 50 μm, greater than 60 μm, greater than 70 μm, greater than 80 μm, greater than 90 μm, greater than 100 μm, greater than 150 μm, greater than 200 μm, and greater than 500 µm. Optionally, the width is in a range of approximately 50 µm to approximately 150 µm, e.g., approximately 100 µm.

In some embodiments, the method includes forming a plurality of insulating layers on the base substrate, one of which is the first insulating layer. Optionally, the groove is formed to extend into the plurality of insulating layers. In one example, the method includes forming a first insulating layer on the base substrate, forming a second insulating layer on a side of the first insulating layer distal to the base substrate, and forming a third insulating layer on a side of the second insulating layer distal to the base substrate. Optionally, the groove is formed to extend into the first insulating layer, a second insulating layer on a side of the first insulating layer distal to the base substrate, and a third insulating layer on a side of the second insulating layer distal to the base substrate. In one example, the first insulating layer is a first gate insulating layer of the display substrate, the second insulating layer is a second gate insulating layer of the display substrate, and the third insulating layer is an inter-layer dielectric layer of the display substrate.

In some embodiments, the method further includes forming a crack barrier layer on the base substrate and in the peripheral area. In some embodiments, prior to forming the crack barrier layer, the method further includes forming one or more trenches extending into the first insulating layer in the peripheral area. The one or more trenches forms one or more second perimeters each of which substantially surrounding the first perimeter. The crack barrier layer is formed so that the crack barrier layer extends into the one or more trenches. Optionally, the one or more trenches is formed to have a depth along a direction from the first insulating layer to the base substrate substantially same as a depth of the groove along the direction from the first insulating layer to the base substrate. Optionally, the groove and the one or more trenches are formed in a single patterning process using a single mask plate.

In some embodiments, the step of forming the crack barrier layer includes forming a first barrier sublayer and forming a second barrier sublayer on a side of the first barrier sublayer distal to the base substrate. Optionally, the first barrier sublayer is formed to extend into the one or more trenches.

In some embodiments, the method further includes forming a planarization layer in the display area, and forming a pixel definition layer defining a plurality of subpixel apertures on a side of the planarization layer distal to the base substrate. Optionally, the first barrier sublayer and the planarization layer are formed in a same layer in a single patterning process using a same material and a single mask plate. Optionally, the second barrier sublayer and the pixel definition layer are formed in a same layer in a single patterning process using a same material and a single mask plate.

In some embodiments, the method further includes forming a dam layer on a side of the first insulating layer distal to the base substrate. The dam layer forms a third perimeter defining the display area.

In some embodiments, the step of forming the dam layer includes forming a first dam sublayer on a side of the first insulating layer distal to the base substrate, forming a second dam sublayer on a side of the first dam sublayer distal to the first insulating layer; and forming a third dam sublayer on a side of the second dam sublayer distal to the first dam sublayer.

In some embodiments, the method further includes forming a planarization layer in the display area; forming a pixel definition layer defining a plurality of subpixel apertures on a side of the planarization layer distal to the base substrate; and forming a spacer layer for spacing apart the display substrate from a counter substrate in a display panel comprising the display substrate. Optionally, the first dam sublayer and the planarization layer are formed in a same layer in a single patterning process using a same material and a single mask plate. Optionally, the second dam sublayer and the pixel definition layer are formed in a same layer in a single patterning process using a same material and a single mask plate. Optionally, the third dam sublayer and the spacer layer formed in a same layer in a single patterning process using a same material and a single mask plate.

Optionally, the first barrier sublayer, the first dam sublayer, and the planarization layer are formed in a same layer in a single patterning process using a same material and a single mask plate. Optionally, the second barrier sublayer, the second dam sublayer, and the pixel definition layer are formed in a same layer in a single patterning process using a same material and a single mask plate. Optionally, the third dam sublayer and the spacer layer formed in a same layer in a single patterning process using a same material and a single mask plate.

Figure 7A:
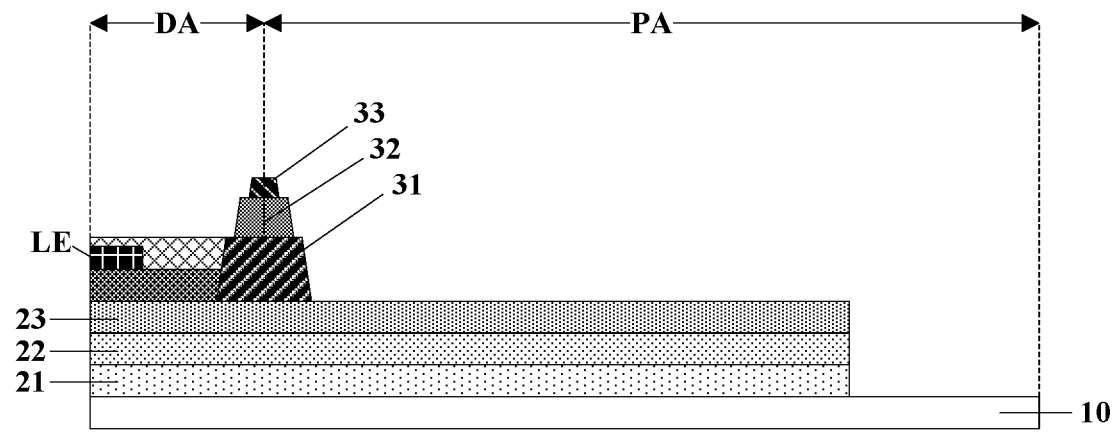
FIGS. 7A to 7D illustrate a process of fabricating a display substrate in some embodiments according to the present disclosure.

FIGS. 7A to 7D illustrate a process of fabricating a display substrate in some embodiments according to the present disclosure. Referring to FIG. 7A, a first insulating layer 21 is formed on the base substrate 10, a second insulating layer 22 is formed on a side of the first insulating layer 21 distal to the base substrate 10, and a third insulating layer 23 is formed on a side of the second insulating layer 22 distal to the base substrate 10. In one example, the first insulating layer 21 is a first gate insulating layer of the display substrate, the second insulating layer 22 is a second gate insulating layer of the display substrate, and the third insulating layer 23 is an inter-layer dielectric layer of the display substrate. A plurality of light emitting element LE are formed in the display area DA of the display substrate. A dam layer, including a first dam sublayer 31 on a side of the first insulating layer 21 distal to the base substrate 10, a second dam sublayer 32 on a side of the first dam sublayer 31 distal to the first insulating layer 21, and a third dam sublayer 33 on a side of the second dam sublayer 32 distal to the first dam sublayer 31, is formed on a side of the third insulating layer 23 distal to the base substrate 10.

Figure 7B:
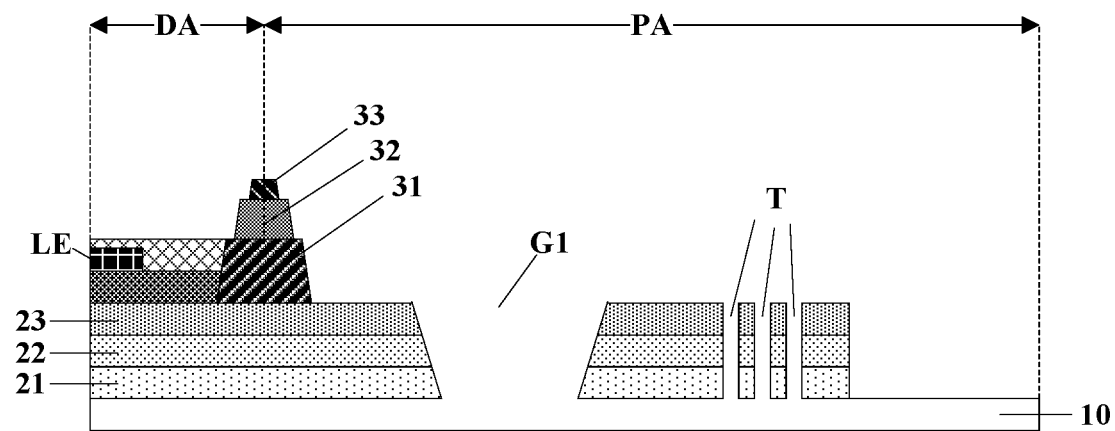

Referring to FIG. 7B, a groove G1 and one or more trenches T are formed to extend into the first insulating layer 21, the second insulating layer 22, and the third insulating layer 23.

Figure 7C:
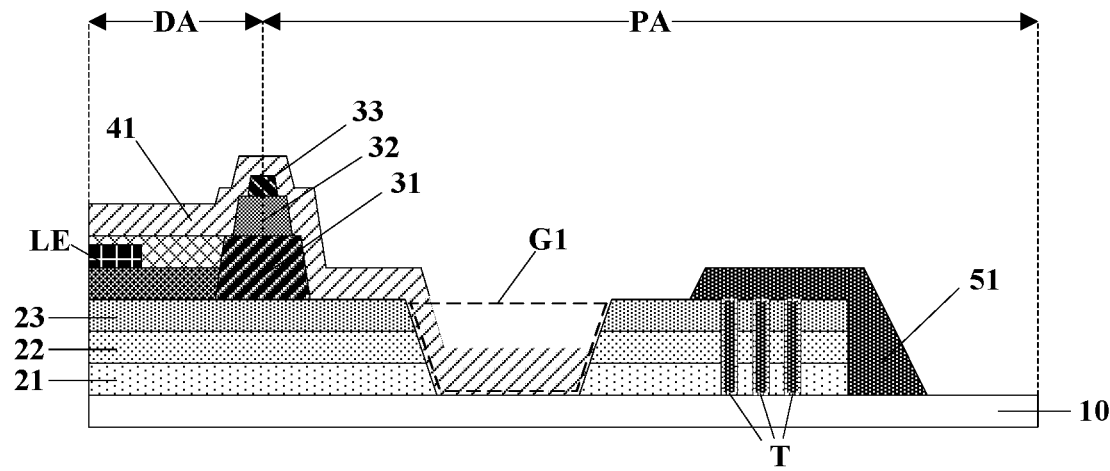

Referring to FIG. 7C, a first barrier sublayer 51 is formed in the peripheral area PA and on a side of the groove G1 distal to the display area DA. The first barrier sublayer 51 is formed to extend into the one or more trenches T. Further, a first inorganic encapsulating sublayer 41 of an encapsulating layer is formed to extend from the display area DA into the peripheral area PA. The first inorganic encapsulating sublayer 41 is formed to extend into at least a portion of the groove G1.

Figure 7D:
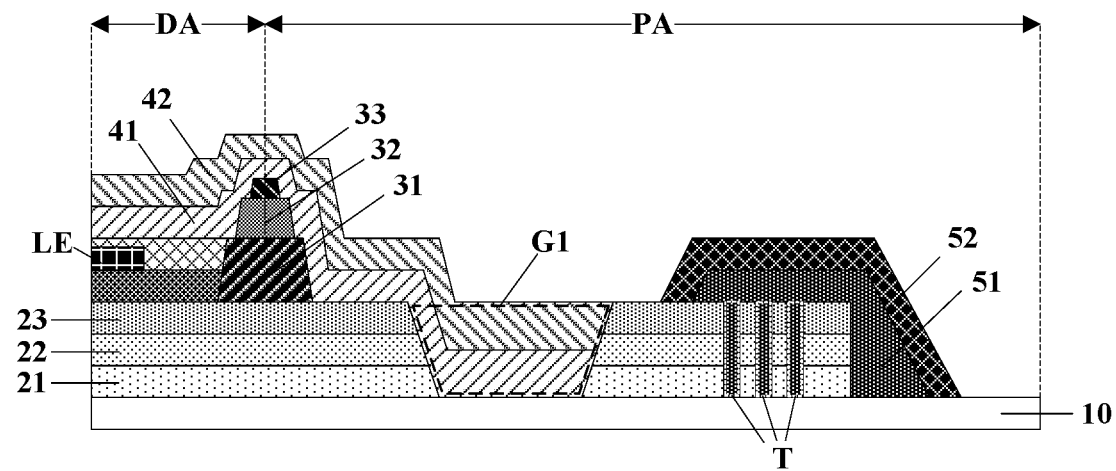

Referring to FIG. 7D, a second inorganic encapsulating sublayer 42 is formed on a side of the first inorganic encapsulating sublayer 41 distal to the base substrate 10. The second inorganic encapsulating sublayer 42 is formed to extend into at least a portion of the groove G1. Further, a second barrier sublayer 52 is formed on a side of the first barrier sublayer 51 distal to the base substrate 10.

Figure 8A:
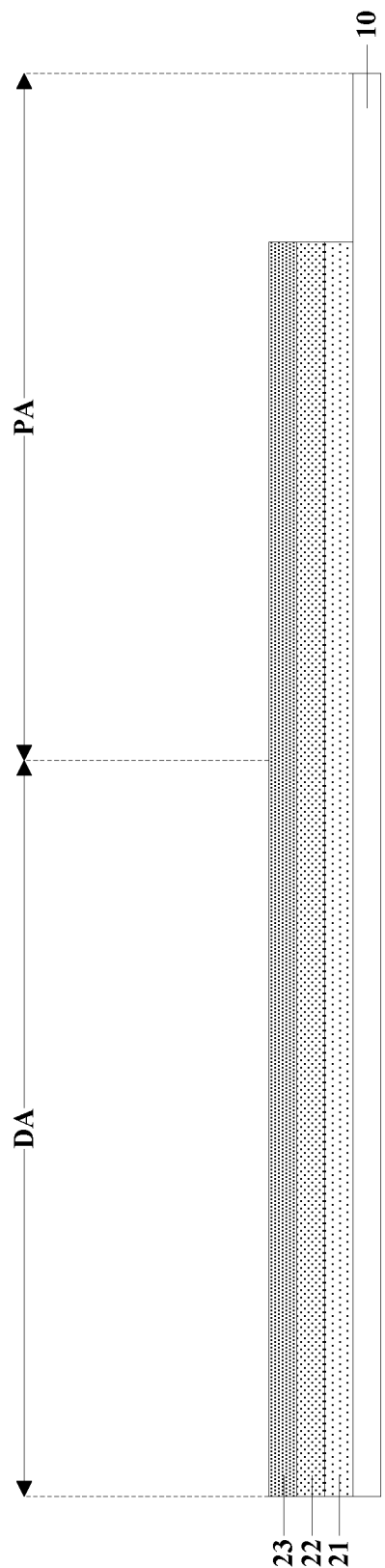

FIGS. 8A to 8E illustrate a process of fabricating a display substrate in some embodiments according to the present disclosure. Referring to FIG. 8A, a first insulating layer 21 is formed on the base substrate 10, a second insulating layer 22 is formed on a side of the first insulating layer 21 distal to the base substrate 10, and a third insulating layer 23 is formed on a side of the second insulating layer 22 distal to the base substrate 10. In one example, the first insulating layer 21 is a first gate insulating layer of the display substrate, the second insulating layer 22 is a second gate insulating layer of the display substrate, and the third insulating layer 23 is an inter-layer dielectric layer of the display substrate.

Figure 8B:
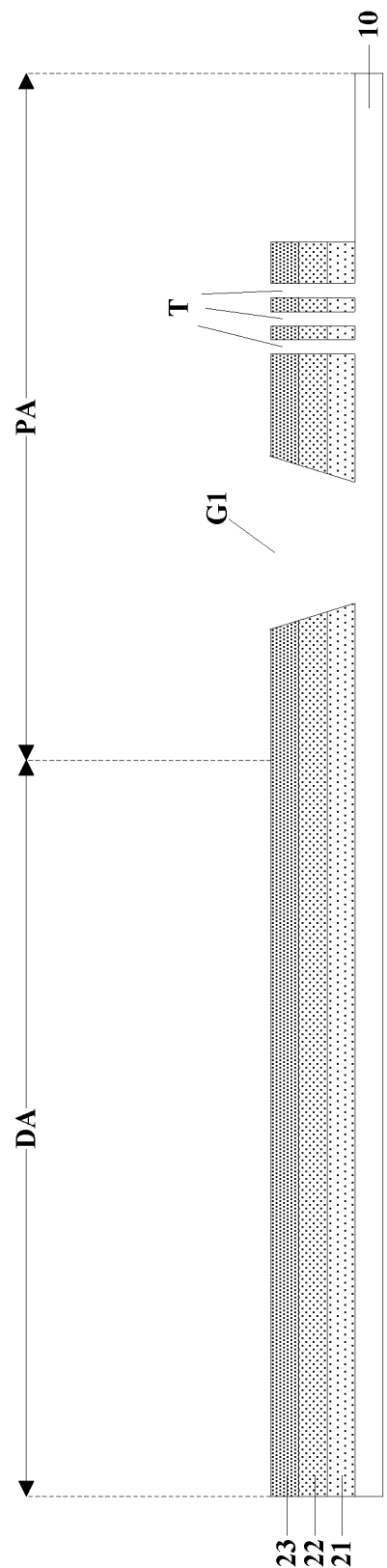

Referring to FIG. 8B, a groove G1 and one or more trenches T are formed to extend into the first insulating layer 21, the second insulating layer 22, and the third insulating layer 23. The groove G1 and the one or more trenches T are formed in a single patterning process using a single mask plate.

Referring to FIG. 8C, a planarization layer 60 is formed on a side of the first insulating layer 21 distal to the base substrate 10, a first dam sublayer 31 is formed on a side of the first insulating layer 21 distal to the base substrate 10 to define the display area DA, and a first barrier sublayer 51 is formed in the peripheral area PA and on a side of the groove G1 distal to the display area DA. The first barrier sublayer 51 is formed to extend into the one or more trenches T. The first barrier sublayer 51, the first dam sublayer 31, and the planarization layer 60 are formed in a same layer in a single patterning process using a same material and a single mask plate. By having the first barrier sublayer 51, the first dam sublayer 31, and the planarization layer 60 formed in a single patterning process, the manufacturing process can be significantly simplified.

Referring to FIG. 8D, a second dam sublayer 32 is formed on a side of the first dam sublayer 31 distal to the first insulating layer 21, a second barrier sublayer 52 is formed on a side of the first barrier sublayer 51 distal to the base substrate 10, and a pixel definition layer 70 is formed in the display area DA to define a plurality of subpixel apertures. The second barrier sublayer 52, the second dam sublayer 32, and the pixel definition layer 70 are formed in a same layer in a single patterning process using a same material and a single mask plate. By having the second barrier sublayer 52, the second dam sublayer 32, and the pixel definition layer 70 formed in a single patterning process, the manufacturing process can be significantly simplified.

Figure 8E:
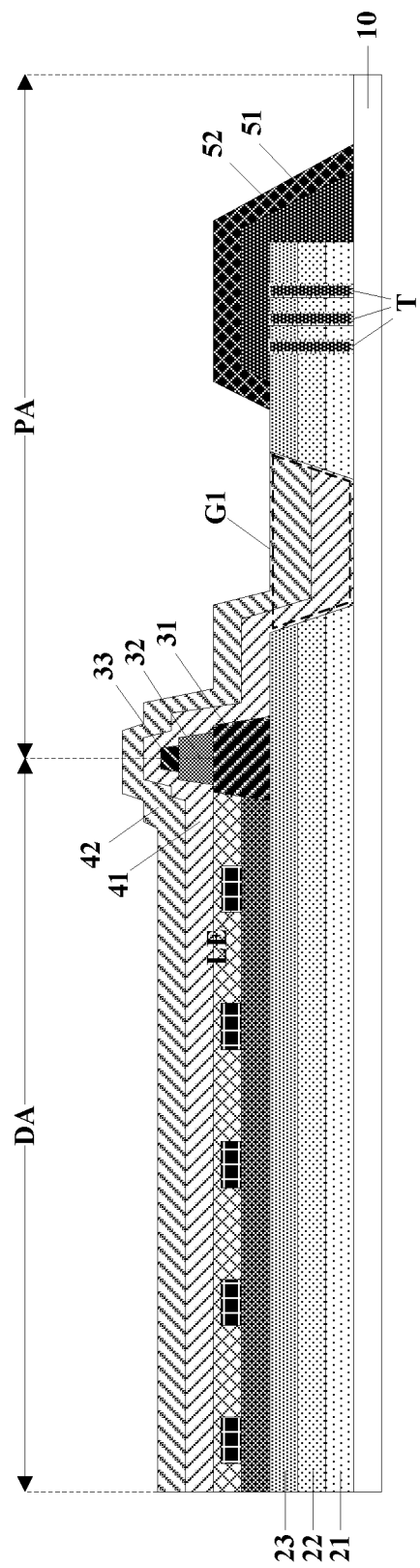

Referring to FIG. 8E, a third dam sublayer 33 is formed on a side of the second dam sublayer 32 distal to the first dam sublayer 31. The third dam sublayer 33 and a spacer layer may be formed in a same layer in a single patterning process using a same material and a single mask plate. Subsequently, a first inorganic encapsulating sublayer 41 of an encapsulating layer is formed to extend from the display area DA into the peripheral area PA. The first inorganic encapsulating sublayer 41 is formed to extend into at least a portion of the groove G1. A second inorganic encapsulating sublayer 42 is formed on a side of the first inorganic encapsulating sublayer 41 distal to the base substrate 10. The second inorganic encapsulating sublayer 42 is formed to extend into at least a portion of the groove G1.

In another aspect, the present disclosure provides a display panel including a display substrate described herein and a counter substrate facing the display substrate. In some embodiments, the plurality of light emitting elements are a plurality of organic light emitting diodes, and the display panel is an organic light emitting diode display panel. In some embodiments, the plurality of light emitting elements are a plurality of quantum dots light emitting diodes, and the display panel is a quantum dots light emitting diode display panel. In some embodiments, the plurality of light emitting elements are a plurality of micro light emitting diodes, and the display panel is a micro light emitting diode display panel.

Figure 9:
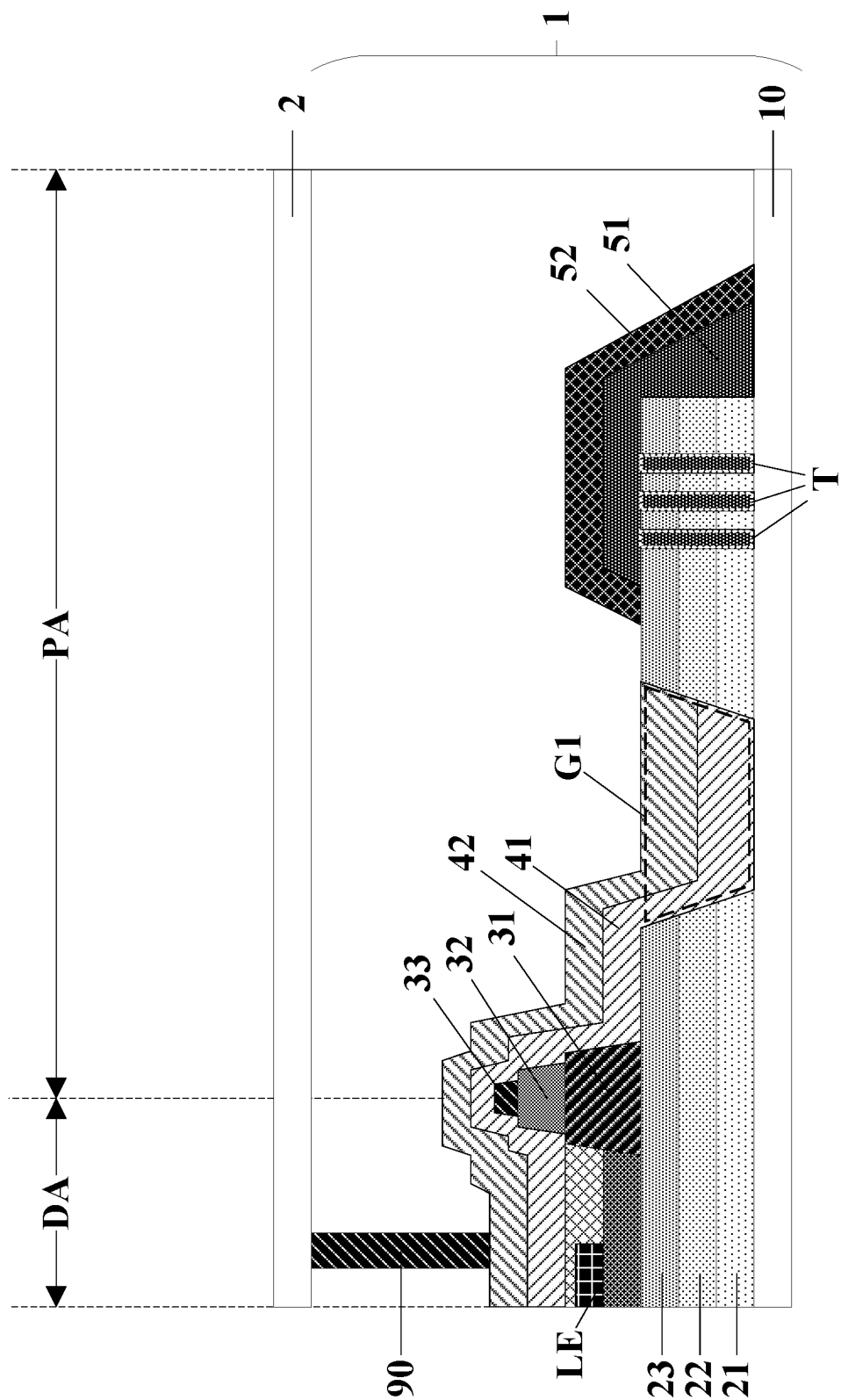
FIG. 9 is a schematic diagram illustrating the structure of a display apparatus in some embodiments according to the present disclosure.

In another aspect, the present disclosure provides a display apparatus including a display panel described herein, and one or more integrated circuits connected to the display substrate. FIG. 9 is a schematic diagram illustrating the structure of a display apparatus in some embodiments according to the present disclosure. Referring to FIG. 9, the display apparatus in some embodiments includes a display substrate 1 and a counter substrate 2 facing the display substrate 1. The display apparatus includes a spacer layer 90 spacing apart the display substrate 1 from the counter substrate 2. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a display area and a peripheral area, comprising:
   a base substrate;
   an insulating layer on the base substrate and in at least the peripheral area;
   a plurality of light emitting elements on the base substrate and in the display area;
   an encapsulating layer on a side of the plurality of light emitting elements distal to the base substrate to encapsulate the plurality of light emitting elements; and
   a dam layer on a side of the insulating layer distal to the base substrate;

wherein the encapsulating layer comprises a first inorganic encapsulating sublayer extending from the display area into the peripheral area;
the display substrate has a groove extending into the insulating layer in the peripheral area, and surrounding at least 50% of a perimeter of the display area;
the first inorganic encapsulating sublayer extends into at least a portion of the groove;
the dam layer comprises a first dam sublayer on a side of the insulating layer distal to the base substrate;
a second dam sublayer on a side of the first dam sublayer distal to the insulating layer;
a third dam sublayer on a side of the second dam sublayer distal to the first dam sublayer;
an orthographic projection of the dam layer on the base substrate spaces apart an orthographic projection of a portion of the first inorganic encapsulating sublayer inside the groove on the base substrate from an orthographic projection of light emitting elements in the display area on the base substrate;
the insulating layer comprises a first portion and a second portion;
an orthographic projection of the first portion on the base substrate covers the orthographic projection of the dam layer on the base substrate;
an orthographic projection of the second portion on the base substrate is non-overlapping with the orthographic projection of the dam layer on the base substrate; and
the orthographic projection of the portion of the first inorganic encapsulating sublayer inside the groove on the base substrate spaces apart the orthographic projection of the first portion on the base substrate from an orthographic projection of the second portion on the base substrate.

2. The display substrate of claim 1, wherein the groove forms a first perimeter surrounding at least 50% of the perimeter of the display area; and
the first inorganic encapsulating sublayer extends into the groove around at least 50% of the first perimeter.

3. The display substrate of claim 1, wherein the encapsulating layer further includes a second inorganic encapsulating sublayer on a side of the first inorganic encapsulating sublayer distal to the base substrate; and
the second inorganic encapsulating sublayer extends into at least a portion of the groove.

4. The display substrate of claim 3, wherein the groove forms a first perimeter surrounding at least 50% of the perimeter of the display area; and
the second inorganic encapsulating sublayer extends into the groove around at least 50% of the first perimeter.

5. The display substrate of claim 1, wherein the groove has a depth along a direction from the insulating layer to the base substrate greater than 50 nm.

6. The display substrate of claim 1, wherein the groove has a width along a direction from the display area to the peripheral area greater than 10 μm.

7. The display substrate of claim 1, wherein the groove extends into a plurality of insulating layers comprising the insulating layer.

8. The display substrate of claim 7, wherein the insulating layer is an inter-layer dielectric layer.

9. The display substrate of claim 7, wherein the groove extends into the insulating layer, a second insulating layer on a side of the insulating layer distal to the base substrate, and a third insulating layer on a side of the second insulating layer distal to the base substrate; and
the third insulating layer is an inter-layer dielectric layer.

10. The display substrate of claim 1, further comprising a crack barrier layer on the base substrate and in the peripheral area.

11. The display substrate of claim 10, wherein the groove forms a first perimeter surrounding at least 50% of the perimeter of the display area;
the display substrate has one or more trenches extending into the insulating layer in the peripheral area, forming one or more second perimeters each of which surrounding at least 50% of the first perimeter; and
the crack barrier layer extends into the one or more trenches.

12. The display substrate of claim 11, wherein the crack barrier layer comprises a first barrier sublayer and a second barrier sublayer on a side of the first barrier sublayer distal to the base substrate; and
the first barrier sublayer extends into the one or more trenches.

13. The display substrate of claim 1, wherein the dam layer forms a perimeter surrounding at least 50% of the perimeter of the display area.

14. The display substrate of claim 1, further comprising a planarization layer in the display area;
a pixel definition layer defining a plurality of subpixel apertures on a side of the planarization layer distal to the base substrate; and
a spacer layer for spacing apart the display substrate from a counter substrate in a display panel comprising the display substrate;
wherein the first dam sublayer and the planarization layer are in a same layer and comprises a same material;
the second dam sublayer and the pixel definition layer are in a same layer and comprises a same material; and
the third dam sublayer and the spacer layer are in a same layer and comprises a same material.

15. The display substrate of claim 1, wherein the display substrate has a single groove extending into the insulating layer in the peripheral area, and surrounding at least 50% of the perimeter of the display area; and
a cross-section of the groove along a plane perpendicular to the base substrate and intersecting the display area and the peripheral area has an inverted trapezoidal shape.

16. The display substrate of claim 1, wherein a depth of the groove is less than a thickness of the dam layer.

17. The display substrate of claim 1, further comprising a first gate insulating layer and a second gate insulating layer;
wherein the insulating layer is an inter-layer dielectric layer between the second gate insulating layer and the dam layer.

18. A display apparatus, comprising the display substrate of claim 1; and
a counter substrate facing the display substrate.

19. A method of fabricating a display substrate having a display area and a peripheral area, comprising:
forming an insulating layer on a base substrate and in at least the peripheral area;
forming a groove extending into the insulating layer in the peripheral area, and substantially surrounding the display area;
forming a plurality of light emitting elements on the base substrate and in the display area;
forming an encapsulating layer on a side of the plurality of light emitting elements distal to the base substrate to encapsulate the plurality of light emitting elements; and
forming a dam layer on a side of the insulating layer distal to the base substrate;

wherein forming the encapsulating layer comprises forming a first inorganic encapsulating sublayer extending from the display area into the peripheral area;

the first inorganic encapsulating sublayer is formed so that the first inorganic encapsulating sublayer extends into at least a portion of the groove;

the dam layer comprises a first dam sublayer on a side of the insulating layer distal to the base substrate;

a second dam sublayer on a side of the first dam sublayer distal to the insulating layer;

a third dam sublayer on a side of the second dam sublayer distal to the first dam sublayer;

an orthographic projection of the dam layer on the base substrate spaces apart an orthographic projection of a portion of the first inorganic encapsulating sublayer inside the groove on the base substrate from an orthographic projection of light emitting elements in the display area on the base substrate;

the insulating layer comprises a first portion and a second portion;

an orthographic projection of the first portion on the base substrate covers the orthographic projection of the dam layer on the base substrate;

an orthographic projection of the second portion on the base substrate is non-overlapping with the orthographic projection of the dam layer on the base substrate; and the orthographic projection of the portion of the first inorganic encapsulating sublayer inside the groove on the base substrate spaces apart the orthographic projection of the first portion on the base substrate from an orthographic projection of the second portion on the base substrate.

* * * * *